US008553489B2

(12) United States Patent
Fujisawa et al.

(10) Patent No.: US 8,553,489 B2
(45) Date of Patent: Oct. 8, 2013

(54) SEMICONDUCTOR DEVICE HAVING POINT-SHIFT TYPE FIFO CIRCUIT

(75) Inventors: Hiroki Fujisawa, Tokyo (JP); Yuuji Motoyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 161 days.

(21) Appl. No.: 13/317,601

(22) Filed: Oct. 24, 2011

(65) Prior Publication Data
US 2012/0120753 A1 May 17, 2012

(30) Foreign Application Priority Data

Nov. 17, 2010 (JP) .................................. 2010-257160

(51) Int. Cl.
*G11C 8/00* (2006.01)
(52) U.S. Cl.
USPC ............ 365/230.01; 365/230.09; 365/233.13; 365/194
(58) Field of Classification Search
USPC .................... 365/230.01, 230.09, 233.13, 194
See application file for complete search history.

(56) References Cited

U.S. PATENT DOCUMENTS

| 7,440,351 | B2 * | 10/2008 | Faue et al. ..................... 365/221 |
| 7,668,039 | B2 | 2/2010 | Fujisawa | |
| 2006/0104150 | A1 * | 5/2006 | Yoshida et al. ............... 365/233 |
| 2009/0010092 | A1 | 1/2009 | Fujisawa | |

FOREIGN PATENT DOCUMENTS

JP          2009-015952  A     1/2009

* cited by examiner

*Primary Examiner* — Vu Le
*Assistant Examiner* — Han Yang
(74) *Attorney, Agent, or Firm* — McGinn IP Law Group, PLLC

(57) ABSTRACT

For example, a semiconductor device includes latch circuits, whose input nodes are connected to an input selection circuit and whose output nodes are connected to an output selection circuit; and a control circuit, which controls the input selection circuit and the output selection circuit. The control circuit includes a shift register to generate an input pointer signal and a binary counter to generate an output pointer signal. The input selection circuit selects one of the latch circuits on the basis of a value of the input pointer signal. The output selection circuit selects one of the latch circuits on the basis of a value of the output pointer signal. Therefore, it is possible to prevent a hazard from occurring in the input selection circuit, as well as to reduce the number of signal lines that transmit the output pointer signal.

21 Claims, 8 Drawing Sheets

SEMICONDUCTOR DEVICE HAVING POINT-SHIFT TYPE FIFO CIRCUIT

BACKGROUND OF THE INVENTION

1. Field of the Invention

The present invention relates to a semiconductor device, and particularly to a semiconductor device equipped with an address counter using a point-shift type FIFO circuit.

2. Description of Related Art

A synchronous memory device, represented by a synchronous DRAM (Dynamic Random Access Memory), has been widely used for a main memory of a personal computer and the like. The synchronous memory device inputs or outputs data in synchronization with a clock signal supplied from a controller. Therefore, the use of a higher-speed clock leads to an increase in data transfer rate.

However, even in the synchronous DRAM, a DRAM core still operates in an analog mode, requiring a sense operation to amplify extremely weak electric charges. As a result, it is not possible to reduce the time required to output the first data after a read command is issued. Therefore, after a predetermined delay time has passed since the issuing of the read command, the first data are output in synchronization with an external clock.

The delay time in the read operation is usually referred to as "CAS latency," and is set to the integral multiple of a clock cycle. For example, when the CAS latency is five (CL=5), the first data are output in synchronization with an external clock signal of five cycles after a read command is received in synchronization with an external clock signal. That is, five clock cycles later, the first data are output.

Such a delay is necessary even for a write operation. In the write operation, after a predetermined delay time has passed since the issuing of a write command, data need to be input sequentially in synchronization with external clock signal. The delay time in the write operation is usually referred to as "CAS write latency," and is set to the integral multiple of a clock cycle. For example, when the CAS write latency is five (CWL=5), the first data need to be input in synchronization with an external clock signal of five clock cycles after the write command is issued in synchronization with an external clock signal.

Moreover, what is employed by a DDR2 (Double Data Rate 2) or later model SDRAM is a Posted CAS method, which enables a controller to issue to a synchronous memory device a read or write command at an earlier timing than an original issuing timing. The preceding time, i.e. the difference between the original timing at which the read or write command should be issued and the actual timing at which the read or write command is issued in advance, is referred to as additive latency (AL). Therefore, in the read operation for example, the period required to start outputting read data after the read command is issued is defined as AL+CL.

When the Posted CAS method is used, the input timing of a column address is preceded in accordance with the issuing timing of the read or write command. Therefore, the column address needs to be held inside a semiconductor device (synchronous memory device) until the additive latency has passed. For the above purpose, in a DDR2 or later model SDRAM, a FIFO circuit is used to delay an address signal by a predetermined period of time. Such a FIFO circuit is generally referred to as an "address counter."

The simplest way to delay address signals is to input the address signals into a shift register, as well as to use a shift-register type FIFO circuit that sequentially shifts the address signals. However, according to the above method, the number of stages of the shift register required increases in proportion to latency. Therefore, the problem is that a circuit increases in scale accordingly as the latency becomes larger. The latency tends to become larger at a higher clock frequency. Thus, an increase in latency associated with the speeding up of the synchronous memory device is inevitable.

As a FIFO circuit that is smaller in scale than the shift-register type FIFO circuit, a point-shift type FIFO circuit, disclosed in Japanese Patent Application Laid-Open No. 2009-15952, is known. The point-shift type FIFO circuit includes a plurality of latch circuits which are each equipped with an input gate and an output gate, and which are connected in parallel. By electrically connecting any one of a plurality of input gates and any one of a plurality of output gates, the FIFO circuit is able to arbitrarily set a timing to output a latched address signal to a subsequent internal circuit in response to the issuing timing of a read or write command.

The number of latch circuits required for the point-shift type FIFO circuit is not equal to a value of latency, but is defined based on the maximum number of accumulated address signals to be delayed. Therefore, it is possible to make a circuit smaller in size than when a shift register is used.

In an address counter disclosed in Japanese Patent Application Laid-Open No. 2009-15952, an input pointer circuit, which generates an input pointer signal that controls a plurality of input gates, and an output pointer circuit, which generates an output pointer signal that controls a plurality of output gates, are both configured by shift-register type circuits. The shift-register type circuits are able to make a pointer change at high speed in synchronization with a clock signal. Therefore, an excellent feature of the shift-register type circuits is that noise or hazard indicative of uncertain data (uncertain address information) does not appear in an address signal that is input into or output from a latch circuit. However, the number of bits or the number of signal lines of a signal output from a shift-register type circuit becomes equal to the number of input and output gates. Therefore, a large number of signal lines is required.

SUMMARY

In one embodiment, there is provided a semiconductor device that includes: an external terminal to which an address signal is supplied; an input selection circuit; an output selection circuit; a plurality of address latch circuits each having an input node electrically connected to the external terminal via the input selection circuit and an output node electrically connected to an internal circuit via the output selection circuit; and a control circuit including a first circuit of a shift register type that generates a plurality of first control signals indicating a first value and a second circuit of a binary type that generates a plurality of second control signals indicating a second value, wherein the input selection circuit selects any one of the input nodes of the address latch circuits based on the first value, the output selection circuit selects any one of the output nodes of the address latch circuits based on the second value, the first circuit updates the first value in response to an external command that is issued from outside, and the second circuit updates the second value when a predetermined latency defined by an integer multiple of a clock cycle has passed since the external command is issued.

In another embodiment, there is provided a semiconductor device that includes: a signal input line; a signal output line; $2^n$ latch circuits each having an input node and an output node, where n is an integer greater than 1; an input selection circuit connected between the signal input line and the input nodes of the latch circuits; and an output selection circuit connected between the output nodes of the latch circuits and the signal output line, wherein the input selection circuit includes $2^n$ input gates each connected between the signal input line and an associated one of the input nodes of the latch circuits, the output selection circuit includes n output gate stages connected in series between the output nodes of the latch circuits and the signal output line, the output gate stages includes ith output gate stage having $2^{n+1-i}$ output gates, where i is an integer ranging from 1 to n, each of the output nodes of the latch circuits is connected to an associated one of input nodes of the output gates included in a top one of the output gate stages, the $2^{n+1-i}$ output gates included in the ith output gate stage are classified into $2^{n-i}$ output gate pairs, the output nodes of each of the output gate pairs included in a jth output gate stage are commonly connected to an associated one of input nodes of the output gates included in a j+1th output gate stage, where j is an integer ranging from 1 to n-1, the signal output line is connected to an output node of the output gate pair included in the nth output gate stage, and one of the output gates constituting each of the output gate pairs becomes electrically conductive while other of the output gates constituting each of the output gate pairs becomes electrically not conductive.

According to the present invention, in the input selection circuit, using a plurality of first control signals, that are generated by the first circuit of a shift register type not to have uncertain data, it is possible to prevent noise or hazard indicative of uncertain data (uncertain address information) from occurring in an address signal supplied to a plurality of address latch circuits. Moreover, using the second circuit of a binary type, it is possible to reduce the number of plural signal lines, which are associated with a plurality of second control signals required to control the output selection circuit.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

A representative example of the technical concept of the present invention for solving the problems will be described below. It will be understood that what is claimed by the present invention is not limited to such a technical concept and is set forth in the claims of the present invention. That is, a technical idea of the present invention is that an input pointer signal supplied to an input selection circuit of a point-shift type FIFO circuit is generated by a shift register, and an output pointer signal supplied to an output selection circuit of the point-shift type FIFO circuit is generated by a binary counter. Accordingly, a hazard does not occur in an output signal of the input selection circuit. Therefore, a plurality of latch circuits, which are disposed in parallel between the input selection circuit and the output selection circuit, is able to properly latch an address signal supplied at a given timing. Moreover, in a control circuit of the point-shift type FIFO circuit, it is possible to reduce the number of signal lines needed to control the output selection circuit. Incidentally, in the present specification, the situation in which a target signal indicates an uncertain logic state is referred to as "hazard." When a target signal is an address signal, the hazard means that address information is uncertain. When a target signal is a pointer signal, the hazard means that pointer information is uncertain.

Figure 1:
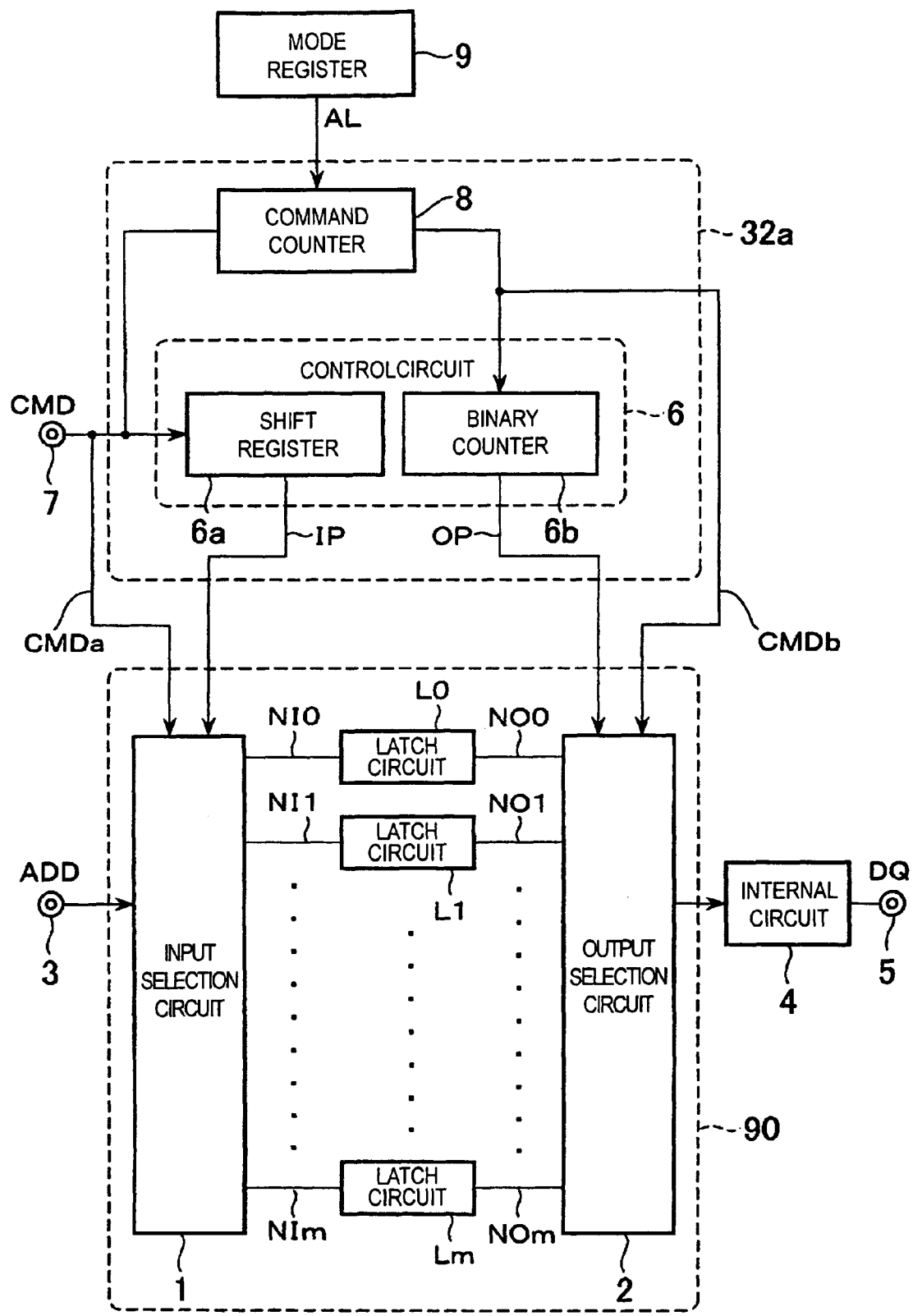
FIG. 1 is a block diagram illustrating the principles of the present invention.

FIG. 1 is a block diagram illustrating the principles of the present invention.

According to the principles of the present invention shown in FIG. 1, a semiconductor device includes a plurality of latch circuits L0 to Lm; an input selection circuit 1 connected to input nodes NI0 to NIm of the latch circuits L0 to Lm, respectively; and an output selection circuit 2 connected to output nodes NO0 to NOm of the latch circuits L0 to Lm, respectively. The input selection circuit 1 is connected to an address terminal 3 supplied with an address signal ADD, and supplies the address signal ADD supplied via the address terminal 3 to any one of the latch circuits L0 to Lm. The output selection circuit 2 selects any one of address signals ADD latched by the latch circuits L0 to Lm, and supplies the selected address signal ADD to an internal circuit 4. The input selection circuit 1, a plurality of latch circuits L0 to Lm, and the output selection circuit 2 correspond to an address counter 90 (shown in FIG. 2) described below. A control circuit 6 corresponds to a pointer signal generating circuit 400 (shown in FIG. 5) described below. The control circuit 6 and a command counter 8 are included in a latency counter 32a (shown in FIG. 2) described below. A mode register 9 correspond to a mode register 56 (shown in FIG. 2) described below.

The internal circuit 4 performs a predetermined operation based on the address signal ADD, and is for example a circuit block that includes not only a memory cell array but also the memory cell array's peripheral circuits, such as a decoder and data input/output circuit. When an address signal ADD is supplied to the internal circuit 4, a memory cell specified by the address signal ADD is accessed. As a result, in a read operation, read data DQ read out from the memory cell are output from a data terminal 5. In a write operation, write data DQ supplied from the data terminal 5 are written into the memory cell. The internal circuit 4 includes a latch circuit, which is not shown in the diagram.

The latch circuit latches an address signal ADD supplied from the output selection circuit 2 after a predetermined setup period has passed since the switching of the output selection circuit 2.

The operations of the input selection circuit 1 and output selection circuit 2 are controlled by the control circuit 6 (pointer signal generating circuit 400). The control circuit 6 contains a shift register 6a, which is a first circuit, and a binary counter 6b, which is a second circuit. A first control signal (input pointer signal) IP output from the shift register 6a is supplied to the input selection circuit 1. A second control signal (output pointer signal) OP output from the binary counter 6b is supplied to the output selection circuit 2. As described later, the first control signal (input pointer signal) IP and the second control signal (output pointer signal) OP each include a plurality of signals. The number of second control signals (output pointer signals) OP is less than the number of first control signals (input pointer signals) IP. The shift register 6a counts up or counts down in response to a command signal CMDa, which is issued from the outside via a command terminal 7. The binary counter 6b counts up or counts down in response to a command signal CMDb, which is delayed by a period of a predetermined latency by the command counter 8. The amount of delay by the command counter 8 can vary according to a preset value AL of the mode register 9.

An operation timing of the input selection circuit 1 is in synchronization with the command signal CMDa.

Therefore, when the command signal CMDa is activated, the input selection circuit 1 supplies an address signal ADD on the address terminal 3 to the input node NIi (i=0 to m), which is indicated by the input pointer signal IP. As a result, the address signal ADD is captured by the latch circuit Li. Moreover, in response to the activation of the command signal CMDa, a count value of the shift register 6a is updated.

An operation timing of the output selection circuit 2 is in synchronization with a command signal CMDb. Therefore, the output selection circuit 2 outputs the address signal ADD, which is stored in the latch circuit Li, via the output node NOi (i=0 to m), which is indicated by the output pointer signal OP at a time when the command signal CMDb is activated. As a result, the address signal ADD stored in the latch circuit Li is supplied to the internal circuit 4. Moreover, in response to the activation of the command signal CMDb, a count value of the binary counter 6b is updated.

In this case, the control signal IP is an output signal from the shift register 6a, and has a m+1 bits structure. Among m+1 bits constituting the control signal IP, only one bit is in an active level, and the remaining m bits are all in an inactive level. Therefore, only one of the input nodes NI0 to NIm is selected at any time, ensuring a proper latch operation.

Meanwhile, the control signal OP is output from the binary counter 6b, and is in binary form. Therefore, the control signal OP has a structure less than m+1 bits. The control signal OP of the binary form always selects any one NOi (i=0 to m) of the output nodes NO0 to NOm. With the control signal OP having the structure with less than m+1 bits, the number of signal lines is reduced compared with the case where a shift register is adopted. However, a hazard may occur when the value of the control signal OP changes. The problem with the occurrence of the hazard can be solved by providing a predetermined time lag between an output operation of the output selection circuit 2 associated with the activation of the command signal CMDb and an update operation of the binary counter 6b. Moreover, the problem can also be solved by using a unidirectional circuit for an output gates including the output selection circuit 2, such as a clocked inverter. That is, when a predetermined time lag is provided between the output operation of the output selection circuit 2 and the update operation of the binary counter 6b, a hazard is not output to the internal circuit 4. Moreover, when the output selection circuit 2 is made by using a unidirectional circuit, latch data does not break due to the backflow of a signal (bus fights among a plurality of signals of a plurality of latch circuits) in the output selection circuit 2.

According to the above configuration, it is possible to ensure a proper FIFO operation, as well as to reduce the number of lines for control signals.

Preferred embodiments of the present invention will be explained below in detail with reference to the accompanying drawings.

Figure 2:
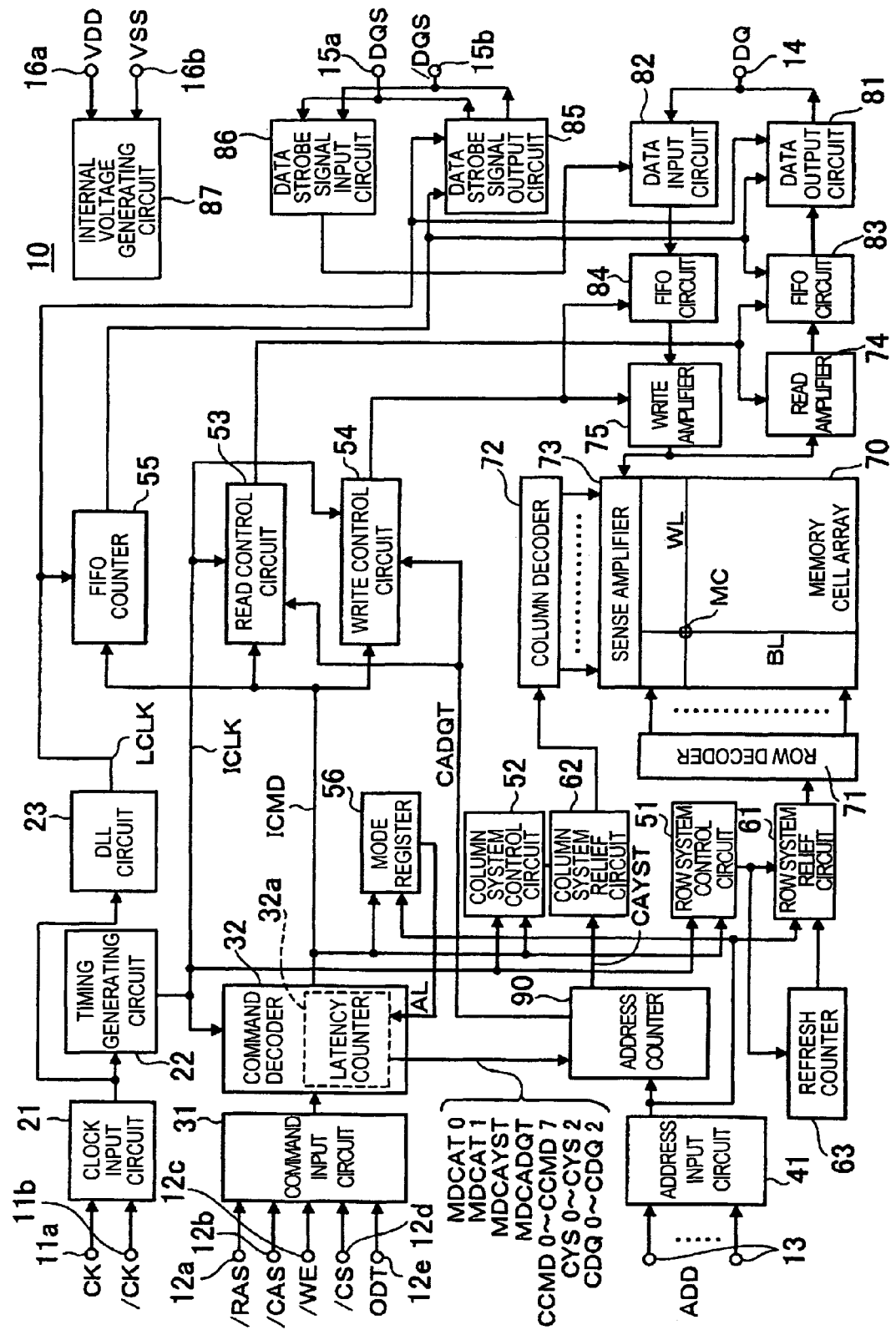
FIG. 2 is a block diagram showing the overall configuration of a semiconductor device 10 according to a preferred embodiment of the present invention.

FIG. 2 is a block diagram showing the overall configuration of a semiconductor device 10 according to a preferred embodiment of the present invention.

The semiconductor device 10 of the present embodiment is a synchronous DRAM, and includes, as external terminals, the following terminals: clock terminals 11a and 11b, command terminals 12a to 12e, address terminals 13, a data input/output terminal 14, data strobe terminals 15a and 15b, and power-supply terminals 16a and 16b. Besides the above terminals, a calibration terminal, clock enable terminal and the like are included, but are not shown in the diagram.

The clock terminals 11a and 11b are terminals to which clock signals CK and /CK are respectively supplied. The clock signals CK and /CK are supplied to a clock input circuit 21. In the present specification, a signal whose name starts with "/" is an inversion or low active signal of the corresponding signal. Accordingly, the clock signals CK and /CK are complementary to each other. An output signal of the clock input circuit 21 is supplied to a timing generating circuit 22 and a DLL circuit 23. The timing generating circuit 22 generates an internal clock signal ICLK and supplies the internal clock signal ICLK to various internal circuits except circuits of a data output system. The DLL circuit 23 generates an output clock signal LCLK and supplies the output clock signal LCLK to the circuits of the data output system.

The output clock signal LCLK generated by the DLL circuit 23 is obtained by controlling phases of the clock signals CK and /CK. The output clock signal LCLK is slightly shifted forward relative to the clock signals CK and /CK so that the phase of the read data DQ (and data strobe signals DQS and /DQS) matches the phases of the clock signals CK and /CK.

The command terminals 12a to 12e are supplied with the following signals, respectively: a row address strobe signal /RAS, a column address strobe signal /CAS, a write enable signal /WE, a chip select signal /CS, and an on die termination signal ODT. The above command signals are supplied to a command decoder 32 via a command input circuit 31. The command decoder 32 generates various internal commands ICMD by performing a process of holding and decoding command signals and other processes in synchronization with the internal clock signal ICLK. The command decoder 32 includes the latency counter 32a. Among the internal commands ICMD, a column-related command is output after additive latency AL is counted by the latency counter 32a. The latency counter 32a includes the command counter 8 and control circuit 6 (the pointer signal generating circuit 400 containing the shift register 6a and the binary counter 6b) shown in FIG. 1. A plurality of control signals related to an internal command ICMD, which is output after a count process by the latency counter 32a, includes a timing signal MDCAYST and a timing signal MDCADQT. The timing signals are supplied to the address counter 90. A timing at which the latency counter 32a outputs the timing signals can vary according to a present value AL, which is preset in the mode register 56. The latency counter 32a also generates a timing signal MDCAT0 and a timing signal MDCAT1, and supplies the timing signals MDCAT0 and MDCAT1 to the address counter 90. The timing signal MDCAT0 is activated at a time when the additive latency AL is set to zero (AL=0). The timing signal MDCAT1 is activated in response to a command supplied from the outside. Besides the above, the generated internal commands are supplied to a row system control circuit 51, a column system control circuit 52, a read control circuit 53, a write control circuit 54, a FIFO counter 55, the mode register 56, the address counter 90 and the likes.

The FIFO counter 55 is a circuit that generates various timing signals after a read or write command is issued so that each circuit block of a column system operates at a predetermined timing.

The address terminal 13 is supplied with an address signal ADD. Among the supplied address signals ADD, a row address is supplied to a row system relief circuit 61 via an address input circuit 41. The address input circuit 41 for example has a circuit structure of a current mirror type and makes a determination primarily as to whether a signal supplied to the address terminal 13 is "1" or "0." Among the address signals ADD supplied from the address input circuit 41, a column address is supplied to the address counter 90 via the address input circuit 41. Moreover, to the row system relief circuit 61, a row address generated by a refresh counter 63 is also supplied. Furthermore, when entry is performed in a mode register set, an address signal ADD is supplied to the mode register 56. The address counter 90 is a circuit that outputs, after a predetermined latency has passed since a column address is input, the column address as an address signal CAYST for the column switch and an address signal CADQT for inputting and outputting of data. The address signal CAYST for a column switch is supplied to a column system relief circuit 62, and the address signal CADQT for inputting and outputting of data is supplied to the read control circuit 53 and the write control circuit 54. The address counter 90 will be described later in detail. Incidentally, the address input circuit 41 is not directly related to the present application; in the present specification, a signal supplied to the address terminal 13 is regarded as an input signal to the address counter 90.

When a row address indicating a defective word line is supplied, the row system relief circuit 61 relieves the row address by accessing a redundant word line instead of the original word line. An operation of the row system relief circuit 61 is controlled by the row system control circuit 51, and an output of the row system relief circuit 61 is supplied to a row decoder 71. The row decoder 71 selects any one of word lines WL included in a memory cell array 70. As shown in FIG. 2, in the memory cell array 70, a plurality of word lines WL and a plurality of bit lines BL cross each other, and memory cells MC are disposed at points of intersection between the word lines WL and the bit lines BL, respectively (In FIG. 2, only one word line WL, one bit line BL and one memory cell MC are shown). The bit lines BL are connected to corresponding sense amplifiers 73, respectively.

When a column address indicating a defective bit line is supplied, the column system relief circuit 62 relieves the column address by accessing a redundant bit line instead of the original bit line. An operation of the column system relief circuit 62 is controlled by the column system control circuit 52.

The address counter 90 includes a function of delaying a column address so that the column address is output to each circuit after a preset additive latency AL has passed since the column address is input in synchronization with a read or write command. Among the column addresses delayed by the address counter 90, an address signal CAYST for a column switch is supplied to a column decoder 72, and an address signal CADQT for inputting and outputting of data is supplied to the read control circuit 53 and the write control circuit 54. As described below, the address counter 90 includes a structure of a point-shift type FIFO circuit.

The column decoder 72 selects any one of sense amplifiers 73 included in the memory cell array 70 on the basis of the address signal CAYST, and corresponds to a data selection circuit of the present invention. A sense amplifier 73 selected by the column decoder 72 is connected to a read amplifier 74 during a read operation, or to a write amplifier 75 during a write operation. An operation of the read amplifier 74 is controlled by the read control circuit 53, and an operation of the write amplifier 75 is controlled by the write control circuit 54.

The data input/output terminal 14 is for outputting read data DQ and inputting write data DQ, and is connected to a data output circuit 81 and a data input circuit 82. The data output circuit 81 is connected to the read amplifier 74 via a FIFO circuit 83. Therefore, a plurality of pieces of read data DQ pre-fetched is output in burst mode from the data input/output terminal 14. The data input circuit 82 is connected to the write amplifier 75 via a FIFO circuit 84. Therefore, a plurality of pieces of write data DQ input from the data input/output terminal 14 in burst mode is simultaneously written into the memory cell array 70.

The data strobe terminals 15a and 15b are for inputting and outputting data strobe signals DQS and /DQS, respectively, and are connected to both a data strobe signal output circuit 85 and a data strobe signal input circuit 86.

As shown in FIG. 2, the data output circuit 81 and the data strobe signal output circuit 85 are supplied with both an output clock signal LCLK generated by the DLL circuit 23 and a timing signal generated by the FIFO counter 55.

The power-supply terminals 16a and 16b are supplied with power supply potentials VDD and VSS, respectively, and are connected to an internal voltage generating circuit 87. The internal voltage generating circuit 87 generates various kinds of internal voltage.

The above has described the overall configuration of the semiconductor device 10 according to the present embodiment. The following describes the address counter 90, which is included in the semiconductor device 10.

Figure 3:
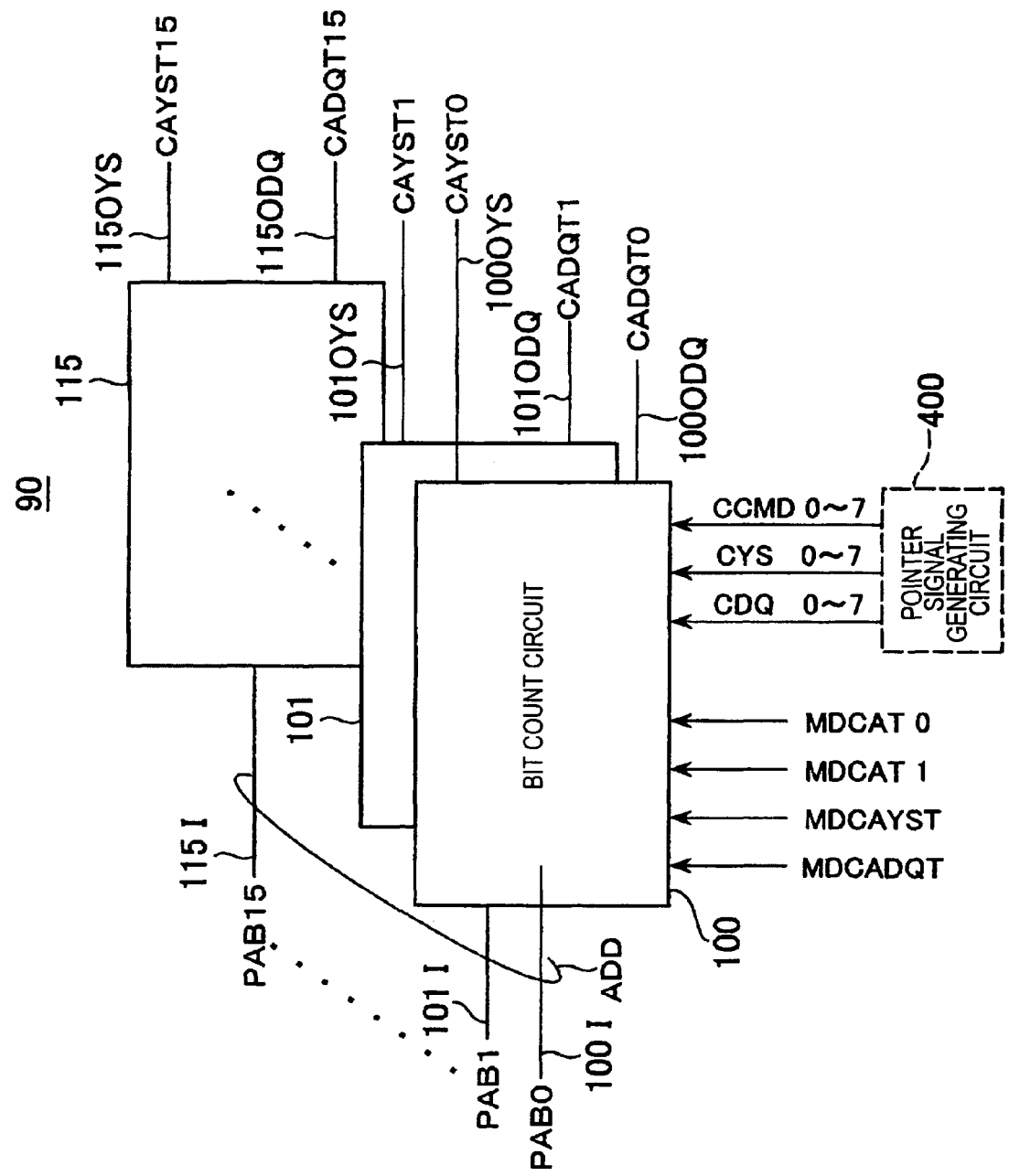
FIG. 3 is a block diagram showing the configuration of an address counter 90.

FIG. 3 is a block diagram showing the configuration of the address counter 90.

As shown in FIG. 3, the address counter 90 includes bit count circuits 100 to 115 provided to corresponding bits PAB0 to PAB15 of an address signal ADD, respectively. The bits PAB0 to PAB15 of the address signal ADD are for example equivalent to column addresses Y0 to Y12 and BA0 to BA2. The pointer signal generating circuit 400 is included in the latency counter 32a, and is therefore shown as reference, indicated by dotted lines. The following signals are generated by the latency counter 32a (shown in FIG. 2) and are each supplied to the bit count circuits 100 to 115 of the address counter 90: a timing signal MDCAYST, a timing signal MDCADQT, a timing signal MDCAT0, a timing signal MDCAT1, input pointer signals CCMD0 to CCMD7, and output pointer signals CYS0 to CYS2 and CDQ0 to CDQ2.

To the bit count circuits 100 to 115, the bits PAB0 to PAB15 of the address signal ADD are respectively input via respective signal input lines 100I to 115I. The input bits PAB0 to PAB15 are then latched in the bit count circuits 100 to 115, respectively. After a predetermined latency has passed, bits CAYST0 to CAYST15 of an address signal CAYST are output from signal output lines 100OYS to 115OYS, respectively, which each corresponds to the bit count circuits 100 to 115. After a predetermined latency has passed, bits CADQT0 to CADQT15 of an address signal CADQT are output from signal output lines 100ODQ to 115ODQ, respectively, which each corresponds to the bit count circuits 100 to 115. The bit count circuits 100 to 115 have the same circuit configuration. According to an aspect of the present application for solving at least one of the problems, attention needs to be paid to the following: All that is required is a circuit configuration for generating at least the address signal CAYST or CADQT. The following describes in a concrete manner the circuit configuration of the bit count circuit 100 among all the bit count circuits.

Figure 4:
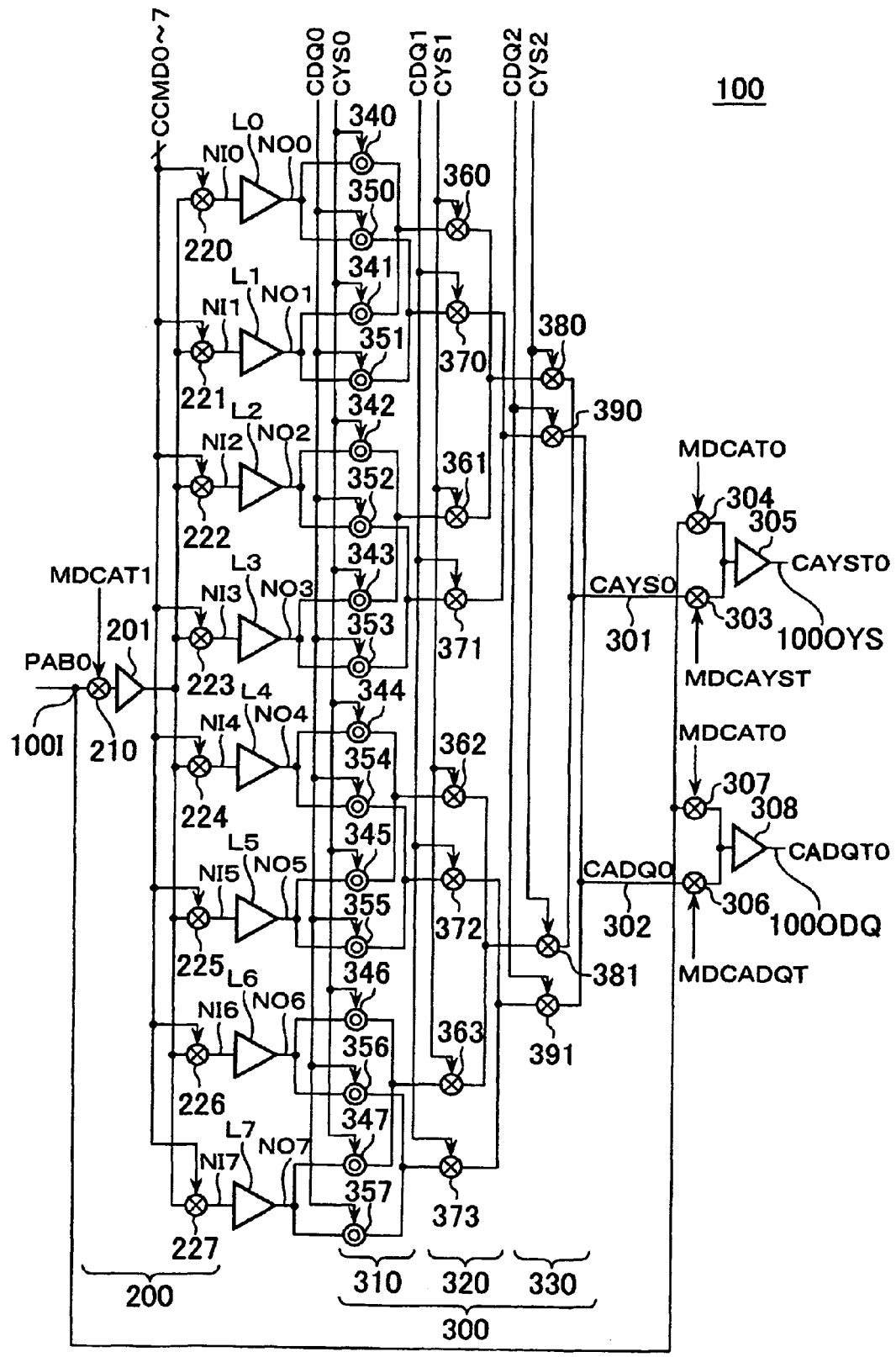
FIG. 4 is a circuit diagram showing a bit count circuit 100.

FIG. 4 is a circuit diagram showing the bit count circuit 100.

As shown in FIG. 4, the bit count circuit 100 includes eight latch circuits L0 to L7; an input selection circuit 200, which is connected between a signal input line 100I and input nodes NI0 to NI7 of the latch circuits L0 to L7; an output selection circuit 300, which is connected between output nodes NO0 to NO7 of the latch circuits L0 to L7 and signal output lines 100OYS and 100ODQ. A timing signal MDCAYST and a timing signal MDCADQT are associated with a command signal CMDb (shown in FIG. 1). A timing signal MDCAT0 and a timing signal MDCAT1 are associated with a command signal CMDa. Input pointer signals CCMD0 to CCMD7 are associated with the input pointer signal IP (shown in FIG. 1). Output pointer signals CYS0 to CYS2 and CDQ0 to CDQ2 are associated with the output pointer signal OP (shown in FIG. 1).

The input selection circuit 200 includes an input gate 210 connected between the signal input line 100I and a buffer 201; and eight input gates 220 to 227 commonly connected to an output node of the buffer 201. The input gate 210 that allows a bit PAB0 of an address signal ADD supplied from the signal input line 100I to pass therethrough in synchronization with a rising edge of a timing signal MDCAT1, which is activated in response to a command supplied from the outside. The bit PAB0 that has passed through the input gate 210 is commonly supplied to the input gates 220 to 227 via the buffer 201. The input gates 201 and 220 to 227 are all circuits of a pass gate type. a symbol of encircled x-mark in FIG. 4 indicates that the circuit is a pass gate.

The input gates 220 to 227 allow the bit PAB0 to pass therethrough in response to corresponding input pointer signals CCMD0 to CCMD7. As for the input pointer signals CCMD0 to CCMD7, only one of the input pointer signals CCMD0 to CCMD7 is at an active level, while all the rest are at an inactive level. Therefore, on the basis of the values of the input pointer signals CCMD0 to CCMD7, the bit PAB0 that has passed through the input gate 210 is supplied to an input node of one of the latch circuits L0 to L7.

The input pointer signals CCMD0 to CCMD7 are generated by a shift register described below.

The output selection circuit 300 includes three output gate stages 310 (top stage), 320 (middle stage) and 330 (final stage), which are connected in cascade between the output nodes NO0 to NO7 of the latch circuits L0 to L7 and signal lines 301 and 302. The signal line 301 transmits a bit CAYS0 for a column switch. The signal line 302 transmits a bit CADQ0 for inputting and outputting of data. The signal line 301 is connected to the signal output line 100OYS via an output gate 303 and a buffer 305. The signal line 302 is connected to the signal output line 100ODQ via an output gate 306 and a buffer 308.

The output gate 303 allows the bit CAYS0 to pass therethrough in synchronization with a rising edge of a timing signal MDCAYST, and outputs the bit CAYS0 as a bit CAYST0 via the buffer 305. Similarly, the output gate 306 allows the bit CADQ0 to pass therethrough in synchronization with a rising edge of a timing signal MDCADQT, and outputs the bit CADQ0 as a bit CADQT0 via the buffer 308. Input nodes of the buffers 305 and 308 are also connected to the signal input line 100I via output gates 304 and 307, respectively. The output gates 304 and 307 become electrically conductive in response to the timing signal MDCAT0. The timing signal MDCAT0 is activated at a time when additive latency AL is set to zero (AL=0). Therefore, when AL=0, the input selection circuit 200, the latch circuits L0 to L7, and the output selection circuit 300 are all bypassed; the bit PAB0 supplied to the signal input line 100I is just output directly to the signal output lines 100OYS and 100ODQ as bits CAYST0 and CADQT0, respectively.

The output gate stage 310 includes eight output gates 340 to 347 related to the address signal CAYST and eight output gates 350 to 357 related to the address signal CADQT. Input nodes of the output gates 340 to 347 are connected to the corresponding output nodes NO0 to NO7 of the latch circuits L0 to L7. Similarly, input nodes of the output gates 350 to 357 are connected to the corresponding output nodes NO0 to NO7 of the latch circuits L0 to L7. The eight output gates 340 to 347 and the eight output gates 350 to 357 are paired form output gate pairs in the four output gates 360 to 363 and the four output gates 370 to 373, respectively. For example, the output gate 340 is paired with the output gate 341 to form an output gate pair. The output nodes of the paired output gates are short-circuited. The output gates 340 to 347 and 350 to 357 are each made up of clocked inverters. Symbols of double circles in FIG. 4 indicates that the circuits are clocked inverters. For example, the clocked inverter is a so-called clocked gate, which supplies a transmitted input signal to a gate electrode of a first transistor, and a control signal to a gate electrode of a second transistor. The first and second transistors are connected in series, and output an output signal corresponding to the input signal from an output node (drain electrode) in response to the control signal.

The output gate stage 320 includes four output gates 360 to 363 and four output gates 370 to 373. The output gate. stage 320 is a circuit of a pass gate type. For example, the pass gate is a so-called transfer gate, and controls whether a signal to be transmitted can pass between a source electrode and drain electrode of a transistor. Input nodes of the output gates 360 to 363 are connected to output nodes of the output gate pairs, which are made up of the output gates 340 to 347 in the output gate stage 310. Similarly, input nodes of the output gates 370 to 373 are connected to output nodes of the output gate pairs, which are made up of the output gates 350 to 357 in the output gate stage 310. The four output gates 360 to 363 and the four output gates 370 to 373 are paired in the four output gates 360 to 363 and the four output gates 370 to 373, respectively, to form output gate pairs. For example, the output gate 360 is paired with the output gate 361 to form an output gate pair. The output nodes of the paired output gates are short-circuited.

The output gate stage 330 includes two output gates 380, 381 and two output gates 390, 391. The output gate stage 330 is a circuit of a pass gate type. Input nodes of the output gates 380 and 381 are connected to output nodes of the output gate pairs consisting of the output gates 360 to 363 in the output gate stage 320. Similarly, input nodes of the output gates 390 and 391 are connected to output nodes of the output gate pairs consisting of the output gates 370 to 373 in the output gate stage 320. The output nodes of the two output gates 380 and 381 are short-circuited to be commonly connected to the signal line 301. Similarly, the output nodes of the two output gates 390 and 391 are short-circuited to be commonly connected to the signal line 302.

To the eight output gates 340 to 347 in the output gate stage 310, a bit CYS0 of an output pointer signal is supplied. To the eight output gates 350 to 357, a bit CDQ0 of an output pointer signal is supplied. The bit CYS0 of the output pointer signal is a one-bit signal that makes the following gate electrically conductive: one gate in each of the output gate pairs consisting of the output gates 340 to 347. Similarly, the bit CDQ0 of the output pointer signal is a one-bit signal that makes the following gate electrically conductive: one gate in each of the output gate pairs consisting of the output gates 350 to 357. Therefore, four out of eight outputs of the latch circuits L0 to L7 are selected by the bits CYS0 and CDQ0 of the output pointer signal, and the selected outputs are then supplied to the subsequent output gate stage 320.

To the four output gates 360 to 363 in the output gate stage 320, a bit CYS1 of an output pointer signal is supplied. To the four output gates 370 to 373, a bit CDQ1 of an output pointer signal is supplied. The bit CYS1 of the output pointer signal is a one-bit signal that makes the following gate electrically conductive: one gate in each of the output gate pairs consisting of the output gates 360 to 363. Similarly, the bit CDQ1 of the output pointer signal is a one-bit signal that makes the following gate electrically conductive: one gate in each of the output gate pairs consisting of the output gates 370 to 373. Therefore, from among the four outputs that are selected by the output gate stage 310 from the eight outputs of the latch circuits L0 to L7, two outputs are selected by the bits CYS1 and CDQ1 of the output pointer signal, and the selected outputs are then supplied to the subsequent output gate stage 330. To the two output gates 380 and 381 in the output gate stage 330, a bit CYS2 of an output pointer signal is supplied.

To the two output gates 390 and 391, a bit CDQ2 of an output pointer signal is supplied. The bit CYS2 of the output pointer signal is a one-bit signal that makes either the output gate 380 or 381 electrically conductive. Similarly, the bit CDQ2 of the output pointer signal is a one-bit signal that makes either the output gate 390 or 391 electrically conductive. Therefore, from among the two outputs selected by the output gate stages 310 and 320 from the eight outputs of the latch circuits L0 to L7, one output is selected by the bits CYS2 and CDQ2 of the output pointer signal, and the selected outputs are then supplied to the signal lines 301 and 302.

In that manner, the output selection circuit 300 is different from the input selection circuit 200, and has a decoding circuit structure to select outputs by means of a plurality of output pointer signals CYS0 to CYS2 and a plurality of output pointer signals CDQ0 to CDQ2, which are three-bit binary signals. Therefore, three signal lines (or six in total for YS and DQ) is required to select outputs of the eight latch circuits L0 to L7 is three. Thus, it is possible to reduce the number of lines and the wiring density associated with the pattern layout of the address counter 90. On the other hand, if a plurality of input pointer signals CCMD0 to CCMD7 to control the input selection circuit 200 is converted into a format of a three-bit binary signal as in the case of a plurality of output pointer signals CYS0 to CYS2 to control the output selection circuit 300, the counter circuit 90 (input selection circuit 200) becomes redundant. More specifically, between the input gates 220 to 227 and the latch circuits L0 to L7 corresponding to the input gates 220 to 227, additional gates equivalent of the output gate 303 to prevent a hazard need to be added and connected in series. Moreover, a new additional control signal equivalent of the timing signal MDCAYST needs to be generated to control the additional gates. Therefore, it is inadvisable that a plurality of input pointer signals CCMD0 to CCMD7 to control an input-side gate are converted into a format of a binary signal. Furthermore, in terms of characteristics, the conversion is not a good idea. The reason is that the number of gate stages between the signal input line 100I and the latch circuits L0 to L7 increases to three stages of the input gates 210, the input gates 220 to 227 and additional gates, resulting in a redundant critical path. In that respect, a measure taken on an output-side is only to add the output gate 303 (306) on one signal output line (address signal CAYST). The advantage of reducing the number of lines of a plurality of output pointer signals CYS0 to CYS2 exceeds the disadvantage of area to provide three gate stages. In terms of characteristics, there is no problem because the above configuration does not have a great impact on a setup time, which indicates the time required for the timing signals MDCAYST and MDCADQT to be activated after the value of the output pointer signal is correctly updated. Given the above viewpoints, the use of the binarized control signal to control only the output gate sides is effective.

Figure 5:
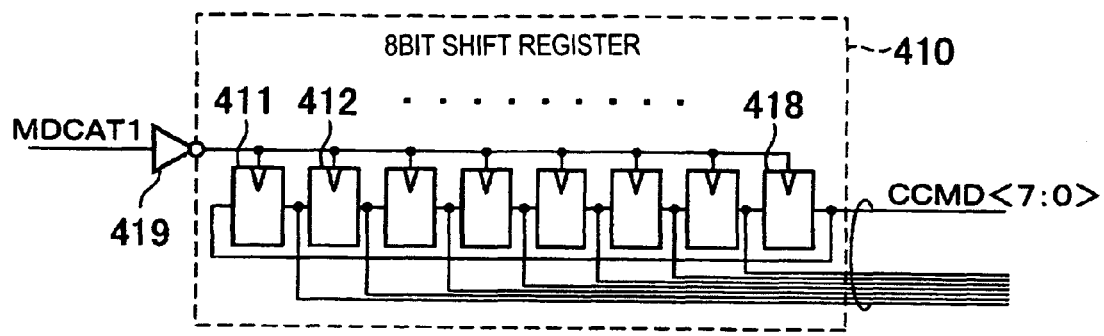
FIG. 5 is a circuit diagram showing a pointer signal generating circuit 400.
Figure 5:
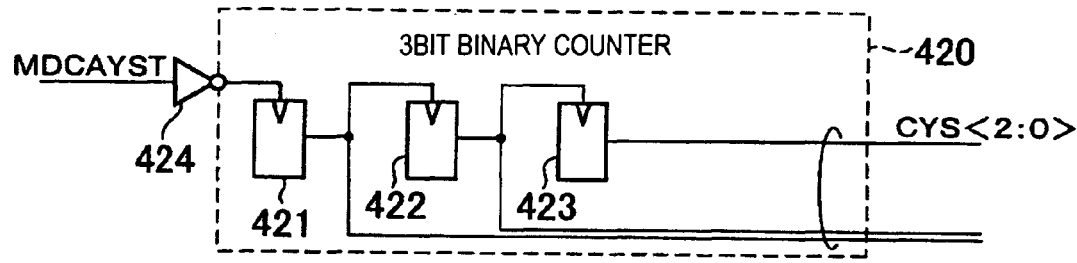
Figure 5:
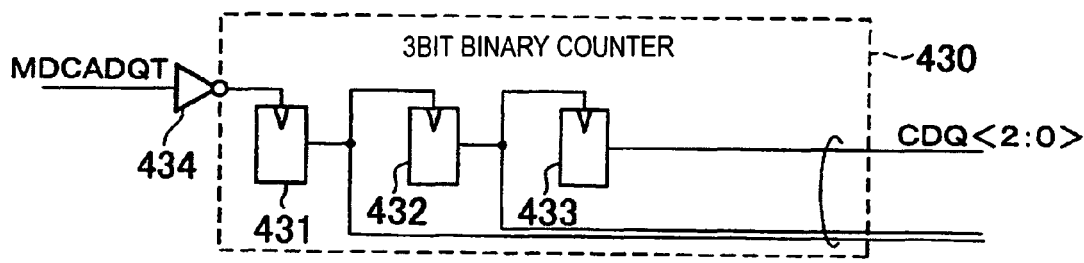

FIG. 5 is a circuit diagram showing the pointer signal generating circuit 400.

The pointer signal generating circuit 400 is equivalent to the control circuit 6 shown in FIG. 1, and is included in the latency counter 32a. As shown in FIG. 5, the pointer signal generating circuit 400 includes a shift register 410, which generates input pointer signals CCMD0 to CCMD7; a binary counter 420, which generates output pointer signals CYS0 to CYS2; and a binary counter 430, which generates output pointer signals CDQ0 to CDQ2.

The shift register 410 consists of eight latch circuits 411 to 418 cyclically connected. Outputs of the latch circuits 411 to 418 are used as input pointer signals CCMD0 to CCMD7. To clock nodes of the latch circuits 411 to 418, a signal that an inverter 419 generates by inverting a timing signal MDCAT1 is supplied. Therefore, a shift operation is performed in synchronization with the inactivation (a change from a high to a low level) of the timing signal MDCAT1. Among the eight latch circuits 411 to 418, only one latch circuit latches an active level, and the remaining seven latch circuits latch an inactive level. Accordingly, when the timing signal MDCAT1 is inactivated, the process of latching the active level shifts to the next latch circuit. Therefore, the values of the input pointer signals CCMD0 to CCMD7 are updated.

The binary counter 420 includes three latch circuits 421 to 423; an output of a preceding latch circuit is input to a clock node of a subsequent latch circuit. Outputs of the latch circuits 421 to 423 are used as output pointer signals CYS0 to CYS2. A clock node of the first latch circuit 421 is supplied with a signal that an inverter 424 generates by inverting a timing signal MDCAYST. As a result, in synchronization with the inactivation (a change from a high to a low level) of the timing signal MDCAYST, a count-up operation takes place. Therefore, when the timing signal MDCAYST is inactivated, the values of the output pointer signals CYS0 to CYS2 in binary format are updated.

The binary counter 430 has the same circuit configuration as the binary counter 420 except that a timing signal MDCADQT inverted by an inverter 434 is input to a clock node of the first latch circuit 431. Outputs of latch circuits 431 to 433 are used as output pointer signals CDQ0 to CDQ2. Therefore, when the timing signal MDCADQT is inactivated, the values of the output pointer signals CDQ0 to CDQ2 in binary format are updated.

In that manner, the circuits that generate output pointer signals are made up of binary counters. Therefore, when the values of the output pointer signals CYS0 to CYS2 and CDQ0 to CDQ2 in binary format are updated by the inactivation of the timing signal MDCAYST or MDCADQT, a hazard occurs in the output pointer signals CYS0 to CYS2 and CDQ0 to CDQ2. That is, in the binary counters 420 and 430, when the timing signals MDCAYST and MDCADQT are inactivated, a hazard occurs in an update process because the values of the output pointer signals are sequentially updated from lower bits. Such a hazard does not occur in the shift register 410.

When a hazard occurs in the output pointer signals CYS0 to CYS2 and CDQ0 to CDQ2, an operation of the output selection circuit 300 is then temporarily in an unstable state. More specifically, in FIG. 4, the following phenomenon may occur: unintended outputs from the latch circuits L0 to L7 appear on the signal lines 301 and 302, or data output from a given latch circuit flow back to another latch circuit.

The phenomenon of the appearance of an unintended output from the latch circuits L0 to L7 onto the signal lines 301 and 302 is solved by the output gates 303 and 306 (shown in FIG. 4). That is, the output gates 303 and 306 allow data on the signal lines 301 and 302 to pass therethrough to the input sides of the corresponding buffers 305 and 308 in synchronization with the activation (a change from a low to a high level) of the timing signals MDCAYST and MDCADQT. Therefore, even if the inactivation (a change from a high to a low level) of the timing signals MDCAYST and MDCADQT causes hazards, which are uncertain data that the output pointer signals CYS0 to CYS2 and CDQ0 to CDQ2 each indicate, during a predetermined period of time and if unintended hazards appear in the address signals CAYS0 and CADQ0 on the signal lines 301 and 302 in a way that corresponds to the above hazards, the hazards do not pass through the output gates 303 and 306. Each of the output gates 303 and 306 is a synchronous output gate.

The phenomenon of the backflow of data output from a given latch circuit to another latch circuit can be prevented by using clocked inverters for the output gates 340 to 347 and 350 to 357 making up the output gate stage 310, among the output gates making up the output selection circuit 300. The clocked inverters are unidirectional circuits, and cannot invert latch data from the output node sides. Therefore, the use of clocked inverters for the output gates making up the output gate stage 310 makes it possible to prevent the backflow of data.

Figure 6:
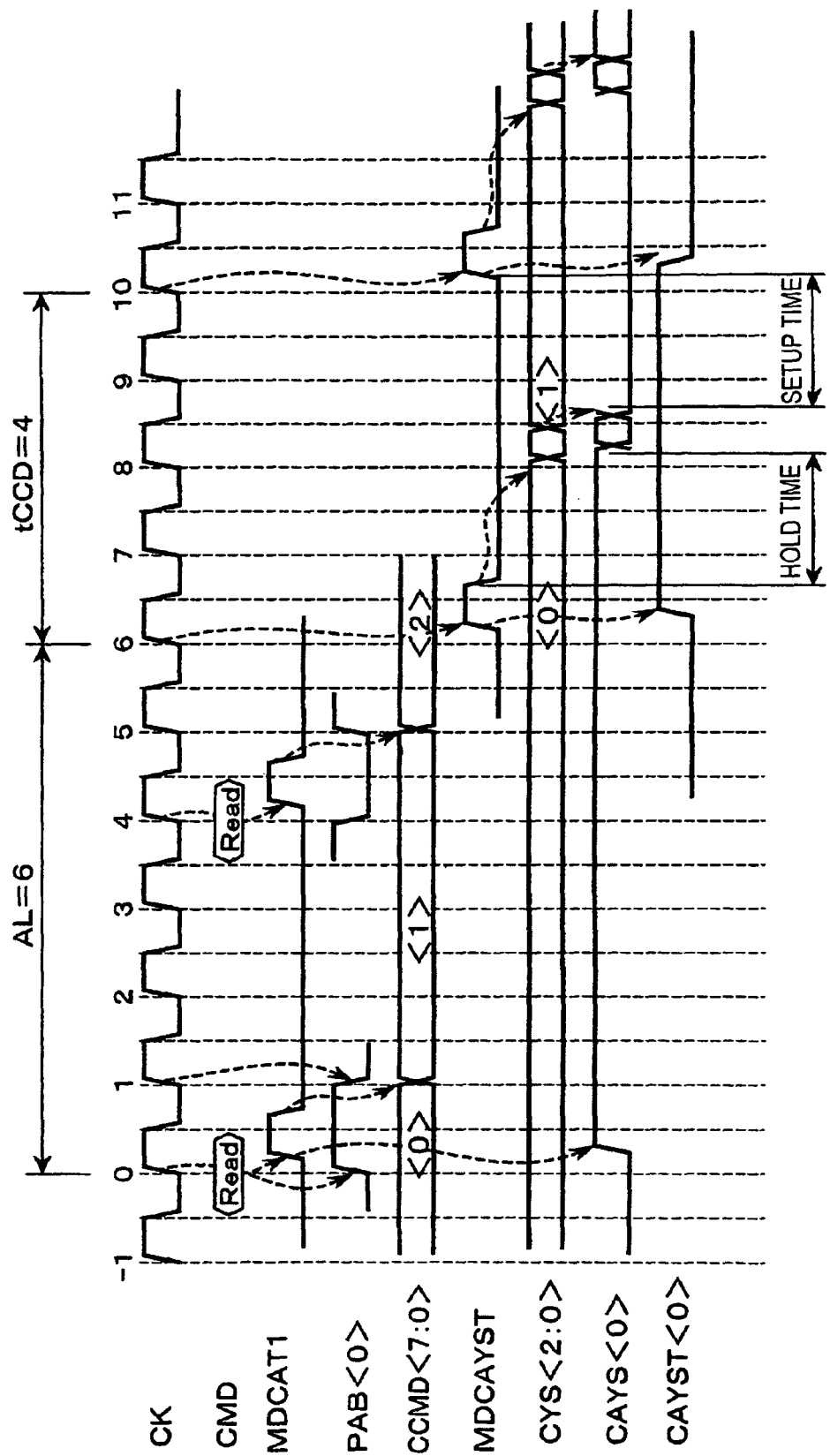
FIG. 6 is a timing chart illustrating an operation of the bit count circuit 100, showing the operation at a time when a count value is six (AL=6)

FIG. 6 is a timing chart illustrating an operation of the bit count circuit 100, showing the operation at a time when a count value is six (AL=6).

In the example shown in FIG. 6, in synchronization with active edges 0 and 4 of an external clock signal CK, read commands are issued. In the present example, a minimum issuing interval tCCD of a column-related command is four clock cycles. Therefore, what is shown in FIG. 6 is the case where read commands are successively issued at minimum intervals (a read command with AL=6 at t0, and a read command at t4).

After a read command is issued in synchronization with active edge 0 of the external clock signal CK, a timing signal MDCAT1 is activated by the command decoder 32 (shown in FIG. 2). As a result, a bit PAB0 of an address signal ADD on the address terminal 13, which is input in synchronization with active edge 0 of the external clock signal CK, is latched by the bit count circuit 100 (shown in FIG. 3) of the address counter 90 (shown in FIG. 2). The latched position is determined by the values of input pointer signals CCMD0 to CCMD7. In the example shown in FIG. 6, the input pointer signal CCMD0 is being activated. Therefore, the bit PAB0 of the address signal ADD is latched by the latch circuit L0 (shown in FIG. 6) in the bit count circuit 100. The remaining bits PAB1 to PAB15 of the address signal ADD are latched by the respective latch circuits L0 in the corresponding bit count circuits 101 to 115. After that, the timing signal MDCAT1 is inactivated, and the values of the input pointer signals CCMD0 to CCMD7 are updated. That is, the input pointer signal CCMD1 is activated.

Then, after the second read command is issued in synchronization with active edge 4 of the external clock signal CK, the timing signal MDCAT1 is activated again by the command decoder 32. As a result, an address signal ADD on the address terminal 13, which is input in synchronization with active edge 4 of the external clock signal CK, is latched by the bit count circuit 100 of the address counter 90. The latched positions are the respective latch circuits L1 in the bit count circuits 100 to 115. After that, the timing signal MDCAT1 is inactivated, and the input pointer signal CCMD2 is activated.

Meanwhile, after additive latency (AL=6) has passed since the first read command is issued, the latency counter 32a activates the timing signals MDCAYST and MDCADQT. As a result, the bits PAB0 on the signal lines 301 and 302 are output to the signal output lines 100OYS and 100ODQ as address signals CAYST0 and CADQT0 via the output gates 303 and 306 and the buffers 305 and 308. The bits PAB0 on the signal lines 301 and 302 are outputs from the latch circuits L0 to L7, and are obtained by being selected by the output pointer signals CYS0 to CYS2 and CDQ0 to CDQ2. At the timing, the values of the output pointer signals CYS0 to CYS2 and CDQ0 to CDQ2 are all "0." Accordingly, the bit PAB0 latched by the latch circuit L0 is output to the signal output lines 100OYS and 100ODQ. Therefore, the bit PAB0 latched six clock cycles ago is output. The same is true for the other bit count circuits 101 to 115, which output corresponding bits PAB1 to PAB15, respectively.

Then, when the timing signals MDCAYST and MDCADQT are inactivated, the values of the output pointer signals CYS0 to CYS2 and CDQ0 to CDQ2 are updated after a predetermined period of time has passed since the inactivation. All the values become "1." As described above, since the output pointer signals are generated by the binary counters 420 and 430, it takes some time to update the values. The time is a hold time. When the value of an output pointer signal goes through a hazard state (uncertain state of information) and is then updated to "1," an address signal ADD latched by the next latch circuit L1 is output to the signal lines 301 and 302 and becomes prepared to be output to the signal output lines 100OYS and 100ODQ. Thus, a setup time means the time required for the timing signals MDCAYST and MDCADQT to be activated since the value of an output pointer signal is correctly updated. Incidentally, a High-period time, which is the time required for the timing signals MDCAYST and MDCADQT to be switched into inactivated state from activated state, requires the time needed for a subsequent-stage internal circuit to latch the address signal via the buffers 305 and 308. In that respect, there is a limit to reducing the High period. Therefore, the hold time tends to become longer because a process of updating the value of an output pointer signal containing a hazard state (uncertain state of information) has started since the inactivation of the timing signals MDCAYST and MDCADQT. The reason is that the process of updating the above value needs to be curbed until the subsequent-stage internal circuit latches the address signal that the address counter 90 outputs after a predetermined additive latency (AL).

The above has described the operation of the bit count circuit 100.

In that manner, according to the present embodiment, the output pointer signals CYS0 to CYS2 and CDQ0 to CDQ2 for controlling the output selection circuit 300 are generated by the binary counters 420 and 430, respectively. Therefore, the number of bits in the output pointer signals CYS0 to CYS2 and CDQ0 to CDQ2 is reduced. As a result, the number of signal lines transmitting the output pointer signals CYS0 to CYS2 and CDQ0 to CDQ2 is reduced. Therefore, it is possible to decrease the wiring density.

Moreover, in response to the activation of the timing signals MDCAYST and MDCADQT, the output gates 303 and 306 are activated, respectively; in response to the inactivation of the timing signals MDCAYST and MDCADQT, the values of the output pointer signals CYS0 to CYS2 and CDQ0 to CDQ2 are updated, respectively. Therefore, a hazard in the output pointer signals CYS0 to CYS2 and CDQ0 to CDQ2 does not cause an unintended address signal ADD to be output to the signal output lines 100OYS and 100ODQ. Moreover, since clocked inverters are used for the output gates 340 to 347 and 350 to 357 making up the output gate stage 310, latch data are not destroyed by the backflow of data.

Furthermore, since the input selection circuit 200 is supplied with the input pointer signals CCMD0 to CCMD7 generated by the shift register 410, a hazard does not occur.

Therefore, it is possible for the address signals ADD to be held properly by the desired latch circuits L0 to L7, and the address signals ADD held by the latch circuits are not destroyed.

Figure 7:
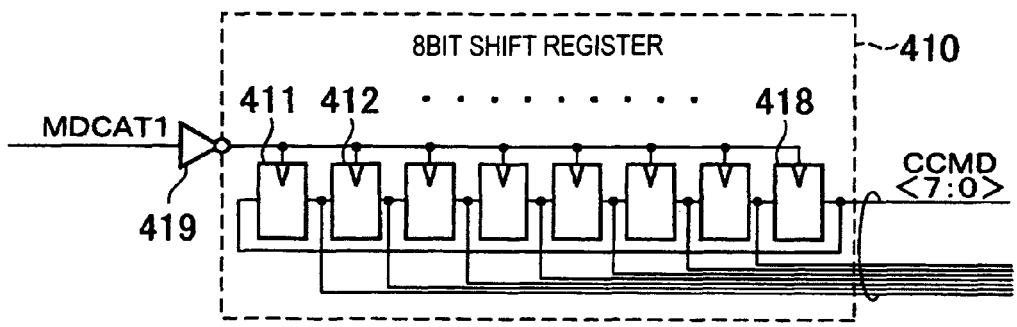
FIG. 7 is a circuit diagram showing a pointer signal generating circuit 400 in a modified example.
Figure 7:
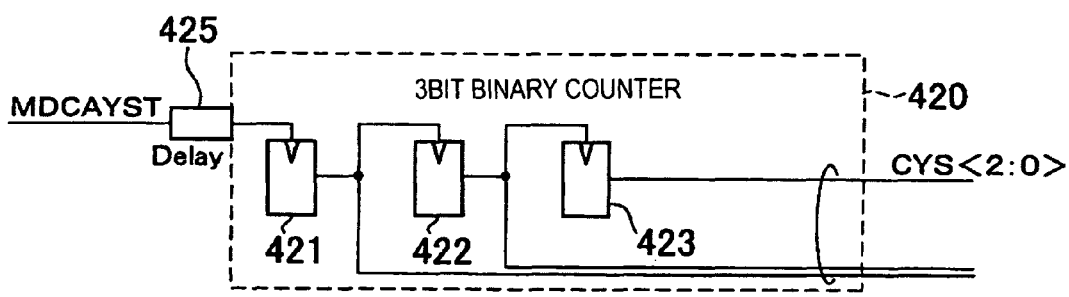
Figure 7:
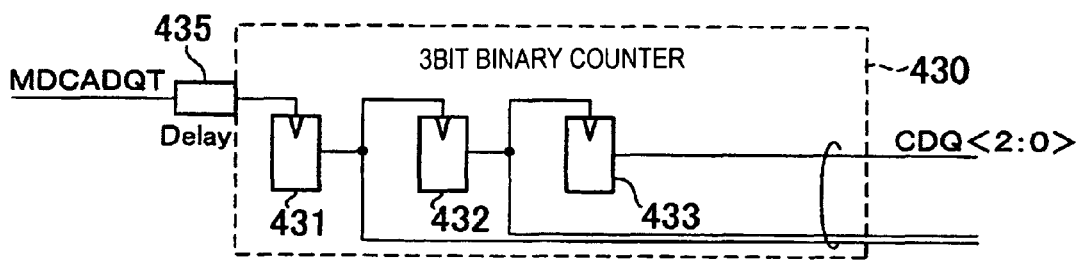

FIG. 7 is a circuit diagram showing a pointer signal generating circuit 400 in a modified example.

In the pointer signal generating circuit 400 shown in FIG. 7, the inverters 424 and 434 included in the binary counters 420 and 430 shown in FIG. 5 are replaced with delay circuits 425 and 435, respectively. Input and output terminals of the delay circuits 425 and 435 are in phase. The pointer signal generating circuits 400 shown in FIGS. 7 and 5 are substantially the same except for the above structure. Therefore, the same elements are represented by the same reference symbols, and will not be described again.

According to the above configuration, an operating timing (updating timing) of the binary counters 420 and 430 is in synchronization with the activation (a change from a low to a high level) of the timing signals MDCAYST and MDCADQT, not with the inactivation (a change from a high to a low level) of the timing signals MDCAYST and MDCADQT.

Figure 8:
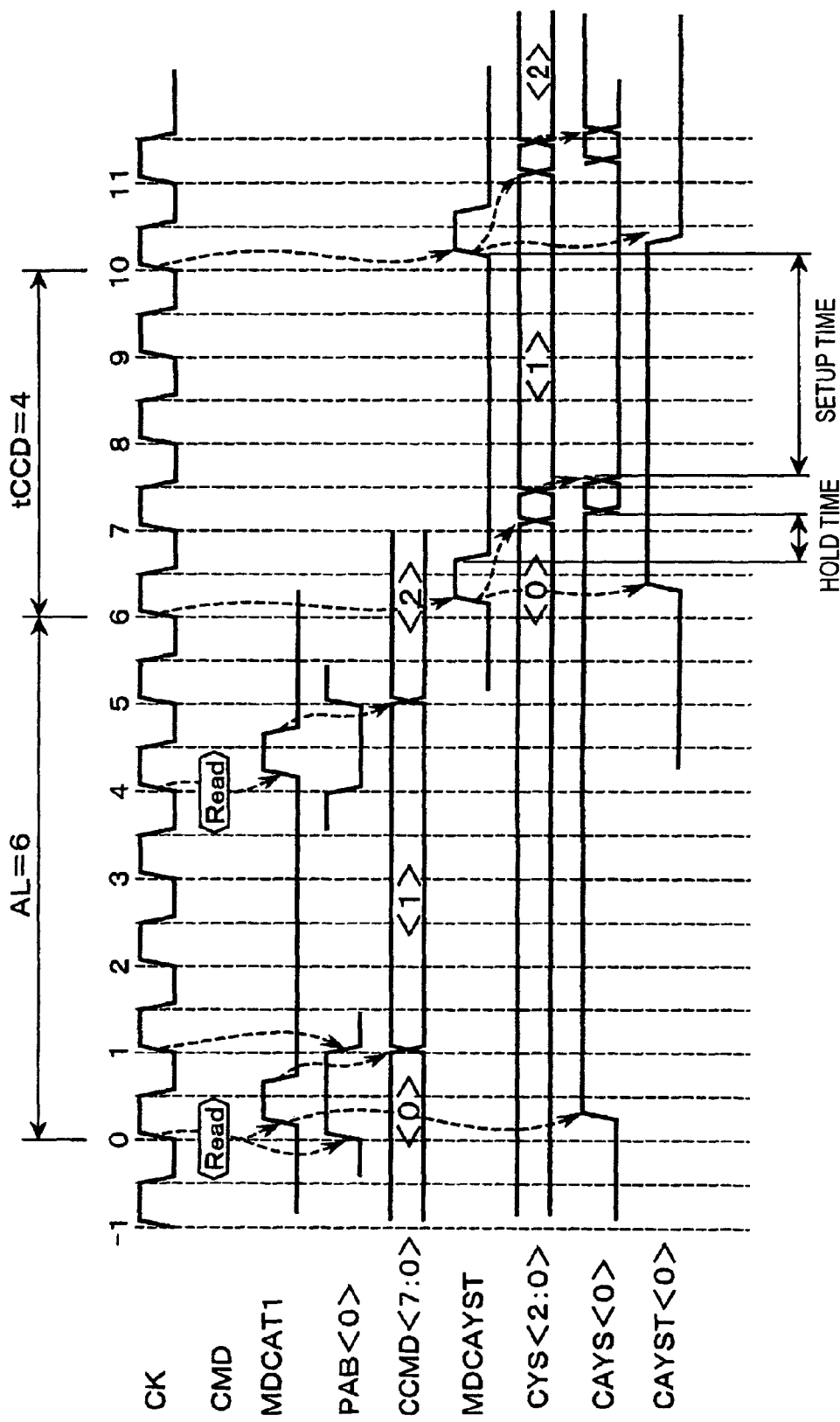
FIG. 8 is a timing chart illustrating an operation of the bit count circuit 100 when the pointer signal generating circuit 400 shown in FIG. 7 is used.

FIG. 8 is a timing chart illustrating an operation of the bit count circuit 100 when the pointer signal generating circuit 400 shown in FIG. 7 is used. The input timings of commands, the settings of latency and the likes are the same as those shown in FIG. 6.

As shown in FIG. 8, in the present example, the activation of the timing signals MDCAYST and MDCADQT causes the address signals CAYST and CADQT to be output to the signal output lines 100OYS and 100ODQ. Then, at a timing when a delay time of the delay circuits 425 and 435 has passed, the values of the output pointer signals CYS0 to CYS2 and CDQ0 to CDQ2 are updated. Accordingly, if the delay time of the delay circuits 425 and 435 is set to be sufficiently short, it is possible to expand the setup time.

As the setup time expands, the hold time decreases accordingly. However, the delay time of the delay circuits 425 and 435 is a fixed, predetermined value, and is not dependent on the frequency of a clock signal. Therefore, the delay time can be designed so as to be at the most appropriate value. Meanwhile, the setup time becomes shorter, as the frequency of a clock signal increases. Therefore, depending on the frequency of a clock signal used actually, a shortage of the setup time could occur. The reason is that the absolute value of the setup time decreases as the frequency of the clock signal increases since the minimum issuing interval tCCD of a column-related command corresponds to the frequency of a clock signal. Even if the frequency of the clock signal is constant when the minimum issuing interval tCCD of the column-related command is reduced from four clock cycles to three clock cycles, the absolute value of the setup time decreases in a similar manner. Meanwhile, in the present example, even though the process of updating the value of an output pointer signal containing a hazard state (uncertain state of information) is curbed by the delay circuits 425 and 435 until a subsequent-stage internal circuit latches an address signal output by the address counter 90 after a predetermined additive latency (AL), while it is also possible to ensure a sufficient setup time by setting a short delay time of the delay circuits 425 and 435.

It is apparent that the present invention is not limited to the above embodiments, but may be modified and changed without departing from the scope and spirit of the invention.

For example, according to the above embodiment, what is described is an example in which eight latch circuits L0 to L7 are provided in each of the bit count circuits 100 to 115. However, the number of latch circuits provided in each bit count circuit is not limited to eight. It is possible to provide $2^n$ latch circuits (n is an integer greater than or equal to 2) in each bit count circuit. In this case, all that is required is to provide $2^n$ input gates between one signal input line and input nodes of the $2^n$ latch circuits in the input selection circuit 200, as well as to provide n output gate stages connected in cascade between output nodes of the $2^n$ latch circuits and one signal output line in the output selection circuit 300. That is, according to the above embodiment, what is shown is an example in which n=3.

If $2^n$ latch circuits (n is an integer greater than or equal to 2) are provided in each bit count circuit, the ith output gate stage (i is an integer ranging from 1 to n), out of the n output gate stages, contains $2^{n+1-i}$ output gates. Moreover, the $2^{n+1-i}$ output gates contained in the ith output gate stage out of the n output gate stages form $2^{n-i}$ output gate pairs, each consisting of two output gates. Output nodes of the $2^{n-j}$ output gate pairs contained in the jth (j is an integer ranging from 1 to n−1) output gate stage out of the n output gate stages are connected to input nodes of $2^{n-j}$ output gates contained in the j+1th output gate stage. Two output nodes of two output gates paired with each other are connected commonly. Two input nodes of two output gates paired with each other are connected to different nodes.

However, according to the present invention, the number of latch circuits provided in a bit count circuit is not necessarily a power of two; the number may be $2^n\alpha$. In this case, the configuration of a binary counter may be altered so that a count value makes one round at the count of $2^n\alpha$.

The technical ideas of the present invention can be applied to input circuits (address input circuit 41) of various circuit types (CMOS type, current-mirror type, or the like). Moreover, the circuit types in each circuit block disclosed in the diagrams, as well as circuits that produce control signals, are not limited to the circuit types disclosed in the example.

The technical concept of the semiconductor device of the present invention may be applied to various semiconductor devices. For example, the present invention may be applied to semiconductor products in general, including functions as CPUs (Central Processing Units), MCUs (Micro Control Units), DSPs (Digital Signal Processors), ASICs (Application Specific Integrated Circuits), ASSPs (Application Specific Standard Products), and memories. Examples of the product types of the semiconductor devices to which the present invention is applicable include an SOC (System On Chip), MCP (Multi Chip Package), and POP (Package On Package). The present invention may be applied to semiconductor devices that have any of such product types and package types.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device comprising:
an external terminal to which an address signal is supplied;
an input selection circuit;
an output selection circuit;
a plurality of address latch circuits each having an input node electrically connected to the external terminal via the input selection circuit and an output node electrically connected to an internal circuit via the output selection circuit; and
a control circuit including a first circuit of a shift register type that generates a plurality of first control signals indicating a first value and a second circuit of a binary type that generates a plurality of second control signals indicating a second value, wherein
the input selection circuit selects anyone of the input nodes of the address latch circuits based on the first value,
the output selection circuit selects any one of the output nodes of the address latch circuits based on the second value,
the first circuit updates the first value in response to an external command that is issued from outside, and
the second circuit updates the second value when a predetermined latency defined by an integer multiple of a clock cycle has passed since the external command is issued.

2. The semiconductor device as claimed in claim 1, wherein
the output selection circuit includes a plurality of output gate stages connected in series between the output nodes of the address latch circuits and the internal circuit,
each of the output gate stages includes a plurality of output gates, and
half of the output gates included in each of the output gate stages are activated based on a logic level of an associated one of the second control signals, respectively.

3. The semiconductor device as claimed in claim 2, wherein
each of the output gates has an input node and output node,
the output nodes of two output gates activated exclusively included in a same output gate stage are coupled in common to the input node of any one of the output gates included in a subsequent output gate stage.

4. The semiconductor device as claimed in claim 2, wherein the input selection circuit includes a plurality of input gates activated exclusively, each of the input gates being coupled between the external terminal and an associated one of the input nodes of the address latch circuits.

5. The semiconductor device as claimed in claim 1, wherein the first circuit updates the first value at a predetermined timing after a first internal command is generated in response to the external command.

6. The semiconductor device as claimed in claim 1, wherein the second circuit updates the second value in response to a second internal command generated after the predetermined latency has passed since the external command is issued.

7. The semiconductor device as claimed in claim 6, wherein
the second internal command is indicated by a pulse signal having a predetermined pulse width, and
the second circuit updates the second value when a predetermined delay time has passed from a first edge of the pulse signal.

8. The semiconductor device as claimed in claim 2, wherein
the output selection circuit further includes a synchronous output gate connected between the internal circuit and a final gate stage of the output gate stages, and
the synchronous output gate receives the address signal of the final gate stage and outputs the address signal to the internal circuit in response to a second internal command generated after the predetermined latency has passed since the external command is issued.

9. The semiconductor device as claimed in claim 1, further comprising a memory cell array that includes a plurality of memory cells, wherein
the internal circuit includes a data selection circuit that selects data to be read out from the memory cell array or to be written into the memory cell array.

10. The semiconductor device as claimed in claim 9, wherein the data selection circuit includes a column decoder that selects, based on the address signal supplied in synchronization with the external command, at least one of a plurality of data readout from the memory cell array through a row access.

11. A semiconductor device comprising:
a signal input line;
a signal output line;
$2^n$ latch circuits each having an input node and an output node, where n is an integer greater than 1;
an input selection circuit connected between the signal input line and the input nodes of the latch circuits; and
an output selection circuit connected between the output nodes of the latch circuits and the signal output line, wherein
the input selection circuit includes $2^n$ input gates each connected between the signal input line and an associated one of the input nodes of the latch circuits,
the output selection circuit includes n output gate stages connected in series between the output nodes of the latch circuits and the signal output line,
the output gate stages includes ith output gate stage having $2^{n+1-i}$ output gates, where i is an integer ranging from 1 to n,
each of the output nodes of the latch circuits is connected to an associated one of input nodes of the output gates included in a top one of the output gate stages,
the $2^{n+1-i}$ output gates included in the ith output gate stage are classified into $2^{n-i}$ output gate pairs,
the output nodes of each of the output gate pairs included in a jth output gate stage are commonly connected to an associated one of input nodes of the output gates included in a j+1th output gate stage, where j is an integer ranging from 1 to n−1,
the signal output line is connected to an output node of the output gate pair included in the nth output gate stage, and
one of the output gates constituting each of the output gate pairs becomes electrically conductive while other of the output gates constituting each of the output gate pairs becomes electrically not conductive.

12. The semiconductor device as claimed in claim 11, wherein each of the output gate stages is controlled by a logic level of an associated one of n-bit output selection signals.

13. The semiconductor device as claimed in claim 12, wherein the one of the output gates constituting each of the output gate pairs becomes electrically conductive and the other of the output gates constituting each of the output gate pairs becomes electrically not conductive based on the logic level of the associated one of n-bit output selection signals.

14. The semiconductor device as claimed in claim 12, further comprising a binary counter that generates the output selection signals, thereby the output selection signals are indicated by a binary count value of the binary counter.

15. The semiconductor device as claimed in claim 14, wherein the binary counter updates the binary count value in response to a second internal command that is generated when a predetermined latency defined by an integer multiple of a clock cycle has passed since an external command is issued.

16. The semiconductor device as claimed in claim 15, wherein
the output selection circuit outputs data held by one of the latch circuit selected based on the output selection signals in response to an activation of the second internal command, and
the binary count value of the binary counter is updated in response to an inactivation of the second internal command after the output selection circuit outputs data held by the latch circuit.

17. The semiconductor device as claimed in claim 15, wherein
the output selection circuit outputs data held by one of the latch circuit selected based on the output selection signals in response to an activation of the second internal command, and
the binary count value of the binary counter is updated after a predetermined delay time has passed since the second internal command is activated after the output selection circuit outputs data held by the latch circuit.

18. The semiconductor device as claimed in claim 15, wherein each of the input gates is controlled by a logic level of an associated one of $2^n$-bit input selection signals.

19. The semiconductor device as claimed in claim 18, further comprising a shift register that generates the input selection signals, wherein one bit of $2^n$-bit input selection signals is brought into an active level.

20. The semiconductor device as claimed in claim 19, wherein
the count value of the shift register is updated in response to a first internal command generated in response to the external command, the first internal command being activated after a signal on the signal input line is supplied to one of the latch circuits corresponding to an activated one of the input selection signal, and
the binary count value of the binary counter is updated after the output selection circuit outputs data held by the latch circuit.

21. The semiconductor device as claimed in claim 11, wherein
the output selection circuit further includes a synchronous output gate connected between the signal output line and final gate stage of the nth output gate stage, and
the synchronous output gate receives a signal of the nth output gate stage and outputs the signal to the signal output line in response to a second internal command generated when a predetermined latency defined by an integer multiple of a clock cycle has passed since an external command is issued.

* * * * *